United States Patent
Xie et al.

(10) Patent No.: US 12,419,080 B2
(45) Date of Patent: Sep. 16, 2025

(54) SEMICONDUCTOR STRUCTURE WITH WRAPPED-AROUND BACKSIDE CONTACT

(71) Applicant: International Business Machines Corporation, Armonk, NY (US)

(72) Inventors: Ruilong Xie, Niskayuna, NY (US); Chanro Park, Clifton Park, NY (US); Min Gyu Sung, Latham, NY (US); Kangguo Cheng, Schenectady, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 494 days.

(21) Appl. No.: 17/968,199

(22) Filed: Oct. 18, 2022

(65) Prior Publication Data

US 2024/0128334 A1    Apr. 18, 2024

(51) Int. Cl.
*H10D 30/67* (2025.01)
*H10D 30/43* (2025.01)
*H10D 62/10* (2025.01)

(52) U.S. Cl.
CPC ......... *H10D 30/6729* (2025.01); *H10D 30/43* (2025.01); *H10D 30/6735* (2025.01); *H10D 62/121* (2025.01)

(58) Field of Classification Search
CPC .......... H10D 30/6735; H10D 30/6757; H10D 30/6729; H10D 30/43; H10D 62/151; H10D 62/364
See application file for complete search history.

(56) References Cited

U.S. PATENT DOCUMENTS

| | | | |
|---|---|---|---|
| 9,570,395 B1 | 2/2017 | Sengupta et al. | |
| 9,601,586 B1 | 3/2017 | Kittl et al. | |
| 10,586,765 B2 | 3/2020 | Smith et al. | |
| 10,636,739 B2 | 4/2020 | Beyne et al. | |
| 10,700,207 B2 | 6/2020 | Chen et al. | |
| 10,797,139 B2 | 10/2020 | Morrow et al. | |
| 11,222,892 B2 | 1/2022 | Su et al. | |
| 2017/0194143 A1* | 7/2017 | Balakrishnan | H01L 21/02603 |
| 2018/0108526 A1* | 4/2018 | Mitard | H10D 30/43 |
| 2019/0057867 A1* | 2/2019 | Smith | H01L 21/02603 |
| 2019/0305106 A1* | 10/2019 | Bi | H10D 30/6212 |
| 2020/0105671 A1 | 4/2020 | Lai et al. | |
| 2021/0111115 A1 | 4/2021 | Morrow et al. | |
| 2021/0134721 A1 | 5/2021 | Chiang et al. | |
| 2021/0193807 A1* | 6/2021 | Guha | H10D 64/01 |
| 2021/0202385 A1 | 7/2021 | Huang et al. | |
| 2021/0305252 A1 | 9/2021 | Chiang et al. | |
| 2021/0305381 A1 | 9/2021 | Chiang et al. | |
| 2021/0351303 A1 | 11/2021 | Ju et al. | |

(Continued)

OTHER PUBLICATIONS

A. Gupta et al., "Buried Power Rail Integration with Si FinFETs for CMOS Scaling beyond the 5 nm Node," 2020 IEEE Symposium on VLSI Technology, Jun. 16-19, 2020, 2 pages.

(Continued)

*Primary Examiner* — Changhyun Yi
(74) *Attorney, Agent, or Firm* — Samuel Waldbaum; Ryan, Mason & Lewis, LLP

(57) ABSTRACT

A semiconductor structure includes a backside contact, and an unmerged source/drain region. The backside contact is wrapped-around the unmerged source/drain region.

20 Claims, 20 Drawing Sheets

(56) References Cited

U.S. PATENT DOCUMENTS

| | | | |
|---|---|---|---|
| 2021/0376071 A1 | | 12/2021 | Liu et al. |
| 2021/0376093 A1 | | 12/2021 | Chu et al. |
| 2021/0399099 A1 | | 12/2021 | Chu et al. |
| 2022/0069117 A1 | | 3/2022 | Yu et al. |
| 2022/0165848 A1 | | 5/2022 | Lin et al. |
| 2022/0165856 A1 | | 5/2022 | Yu et al. |
| 2022/0344472 A1 | * | 10/2022 | Lin .................... H10D 30/6211 |

OTHER PUBLICATIONS

D. Prasad et al., "Buried Power Rails and Back-side Power Grids: Arm CPU Power Delivery Network Design Beyond 5nm," 2019 IEEE International Electron Devices Meeting (IEDM), Dec. 7-11, 2019, pp. 19.1.1-19.1.4.

* cited by examiner

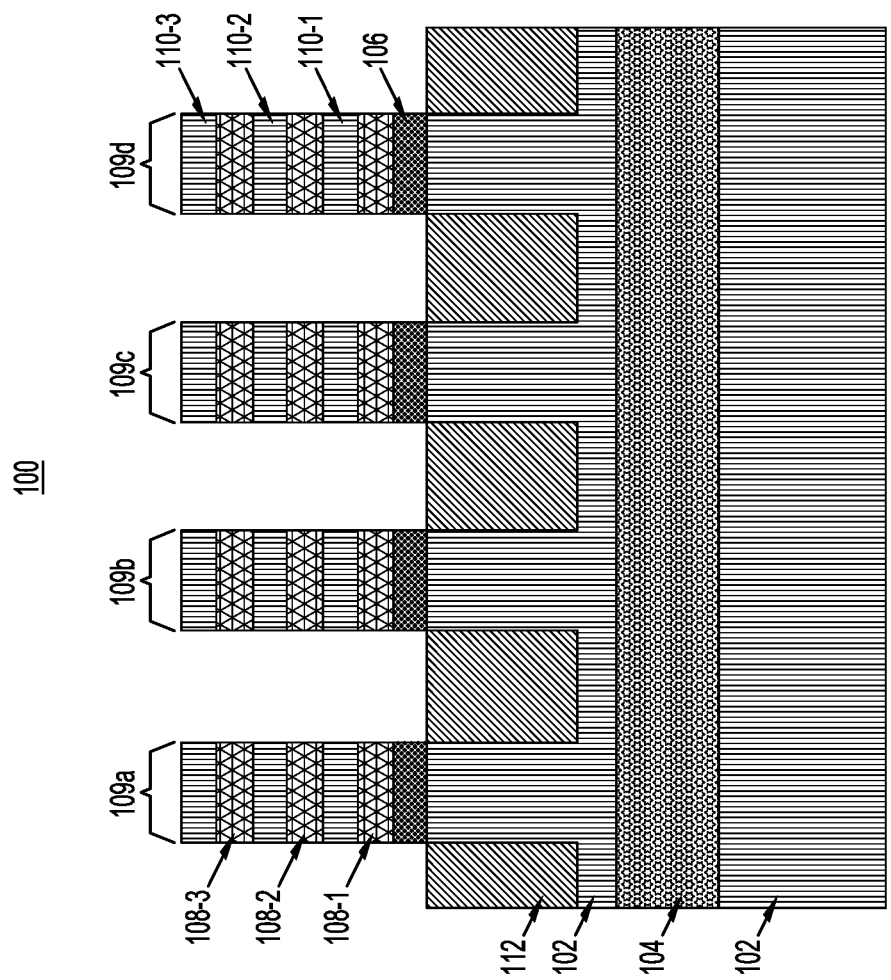

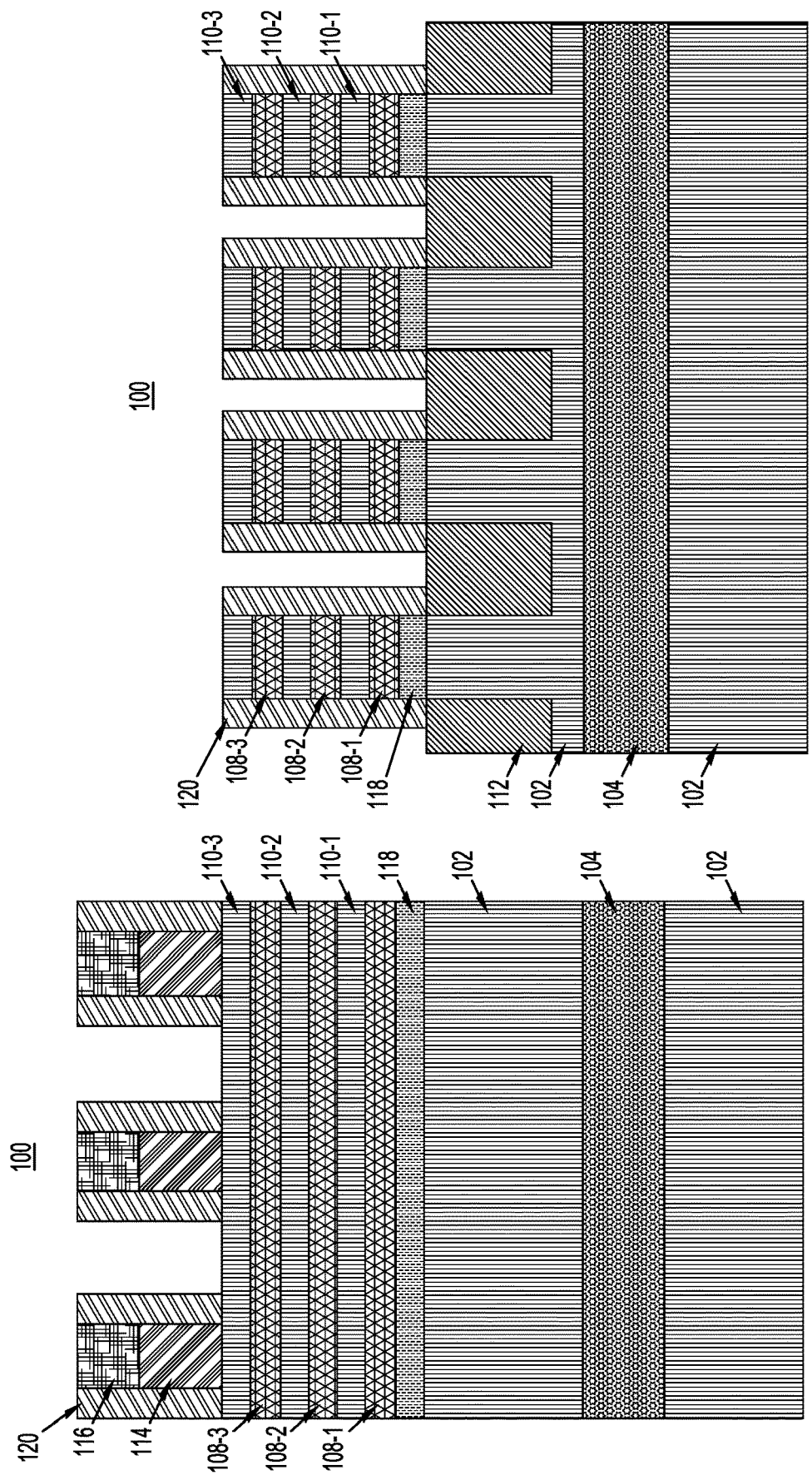

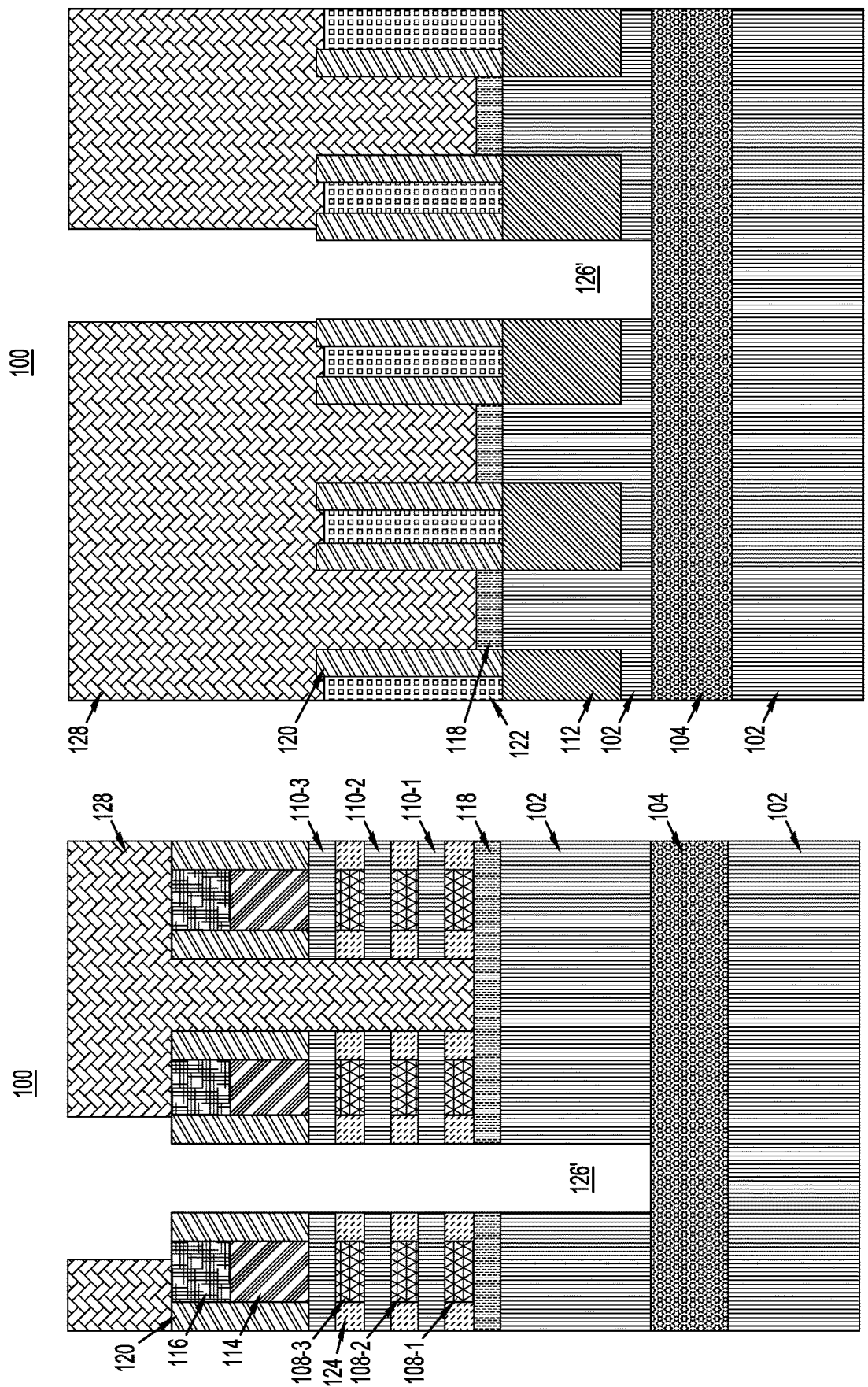

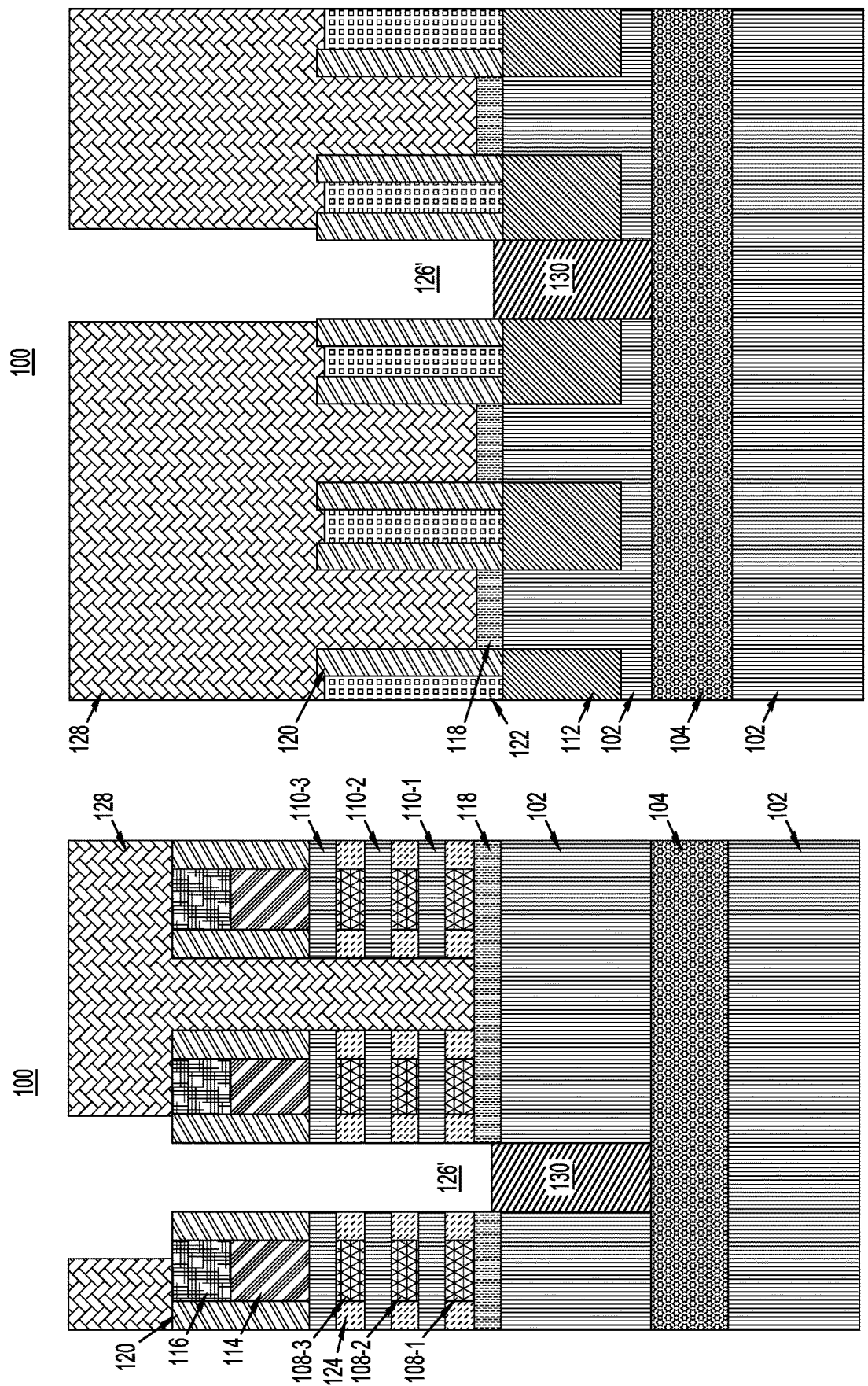

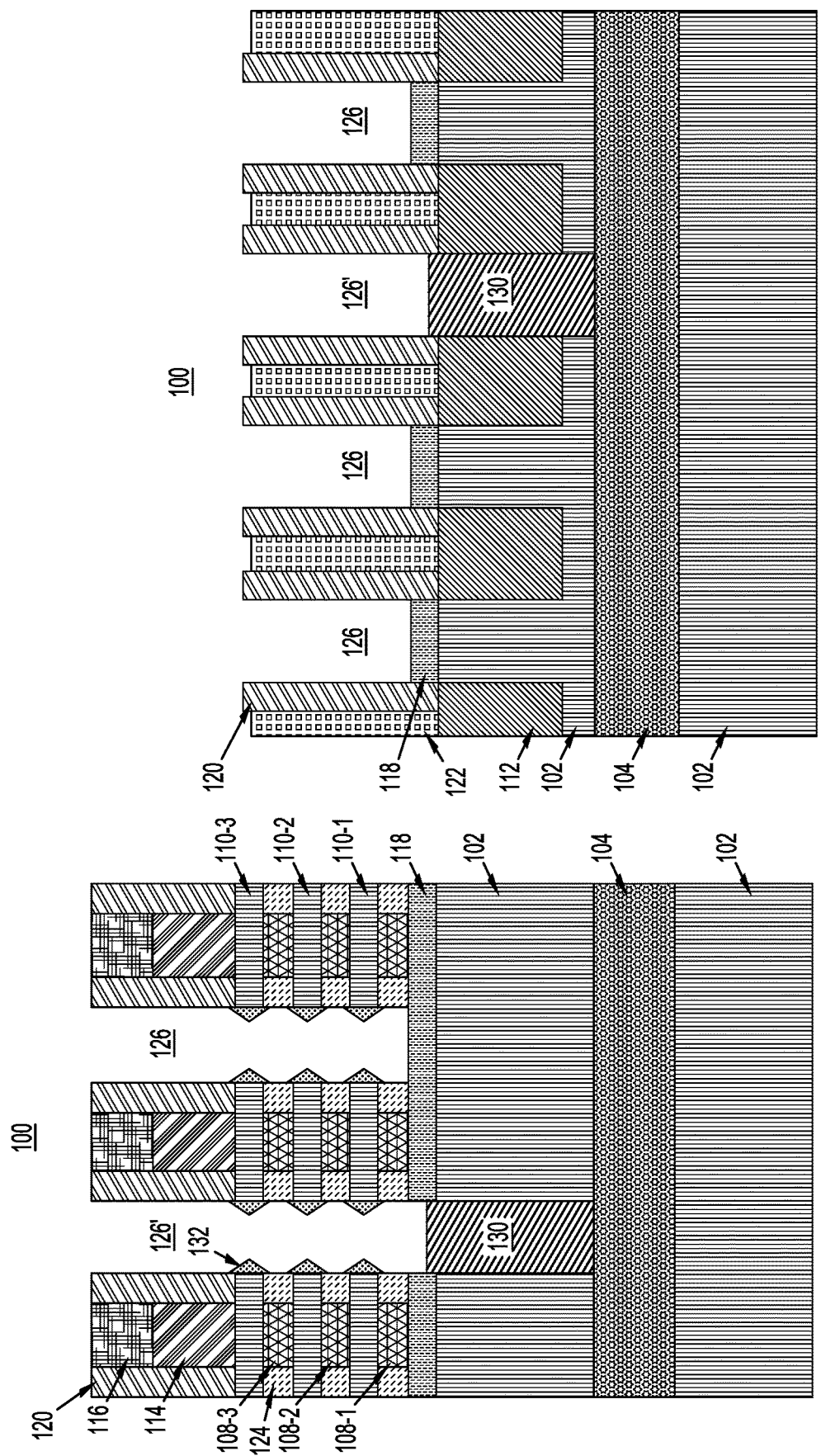

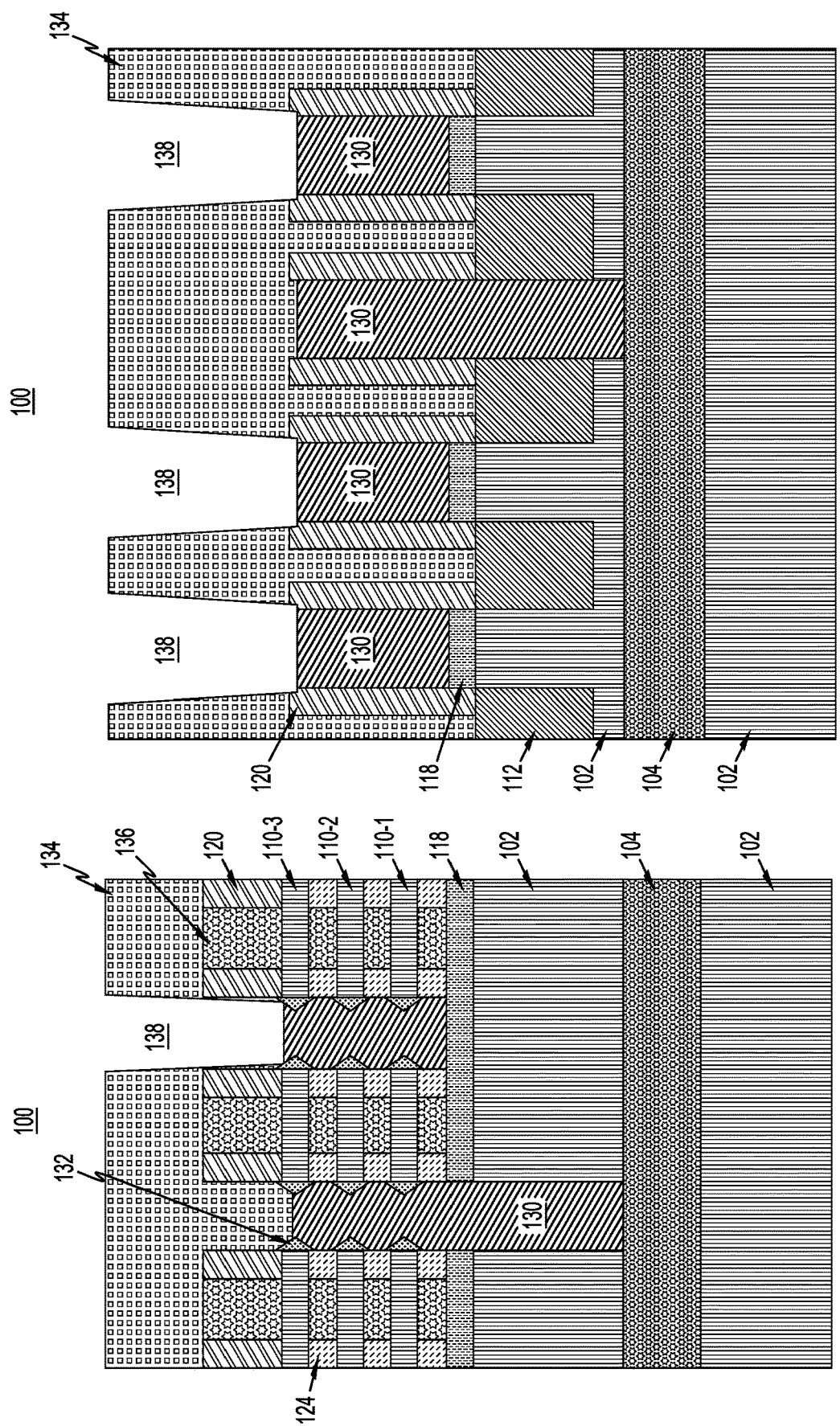

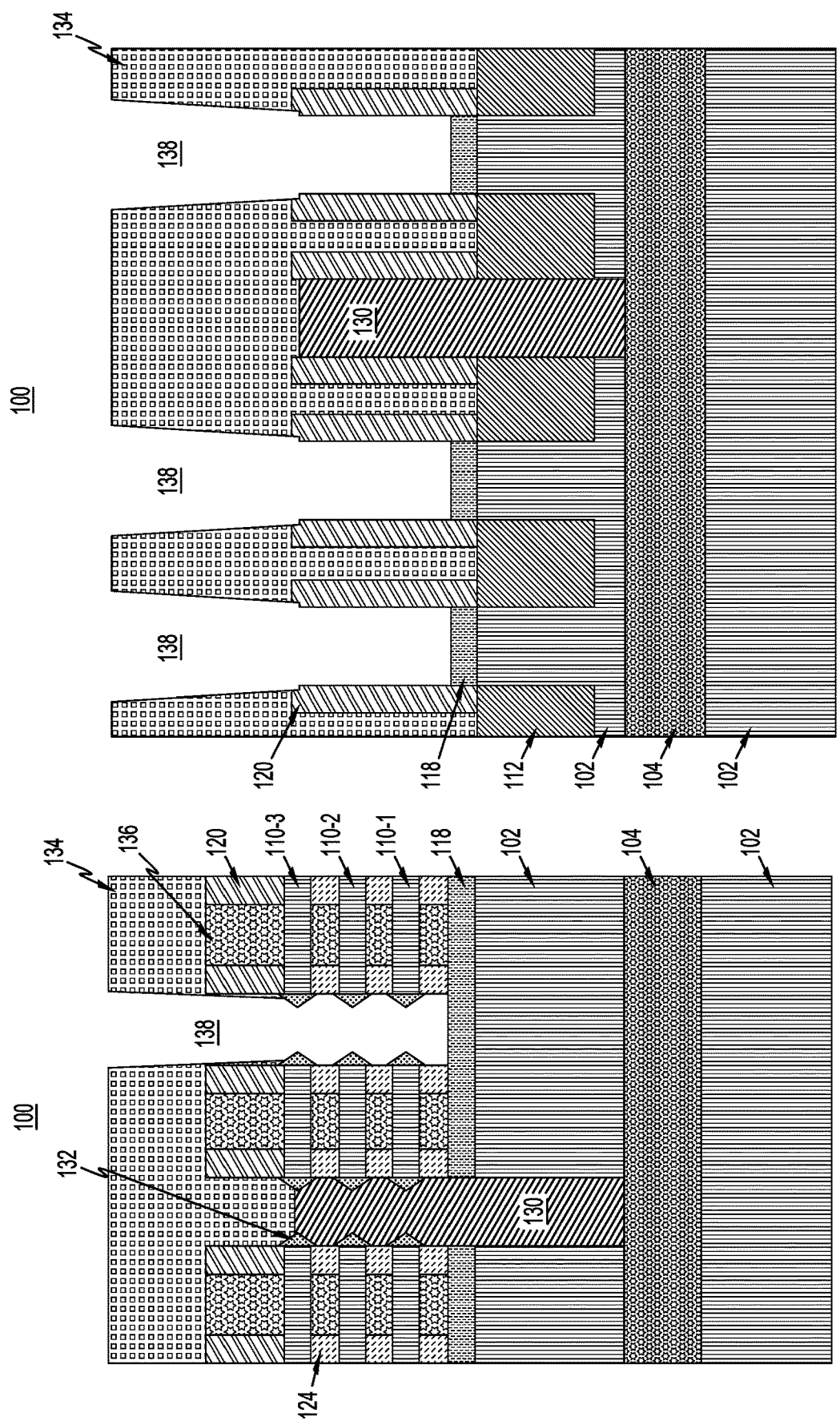

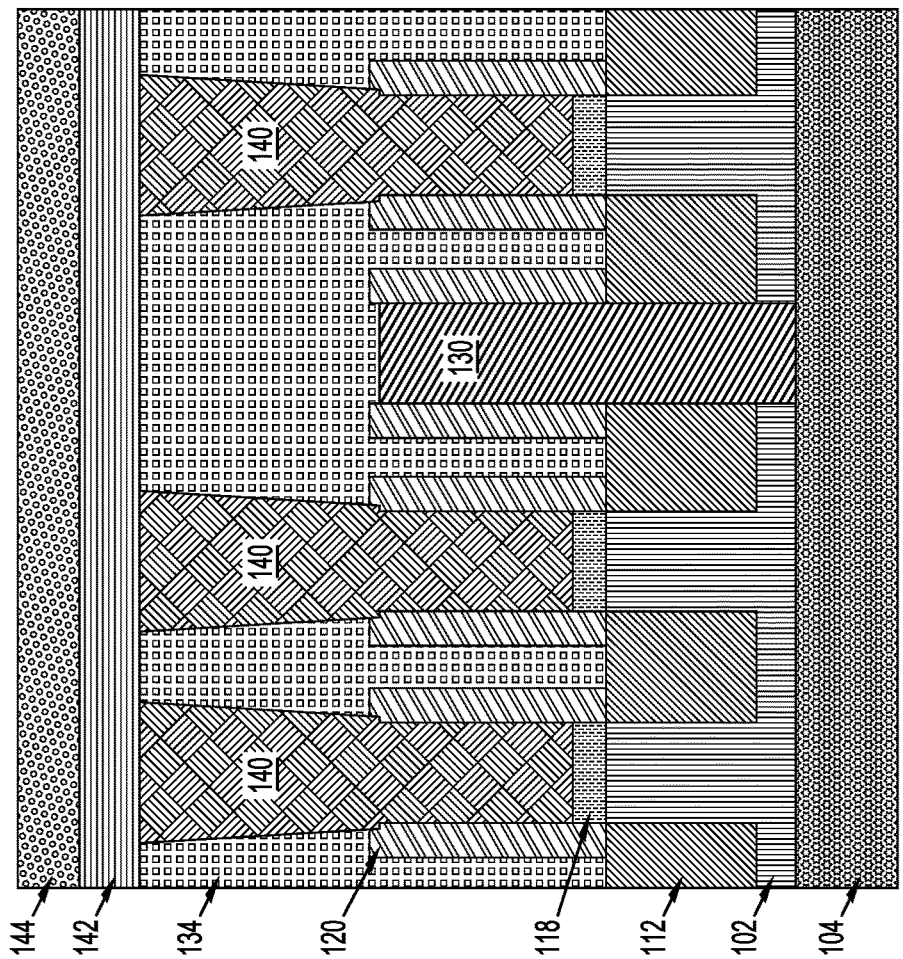
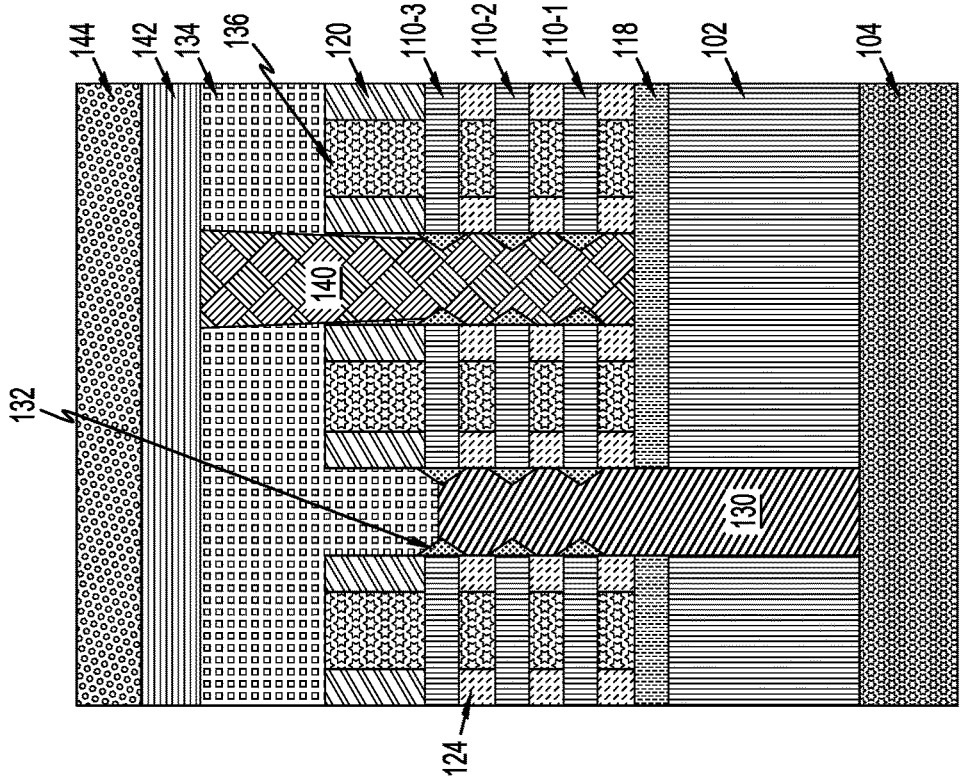
FIG. 14A
FIG. 14B

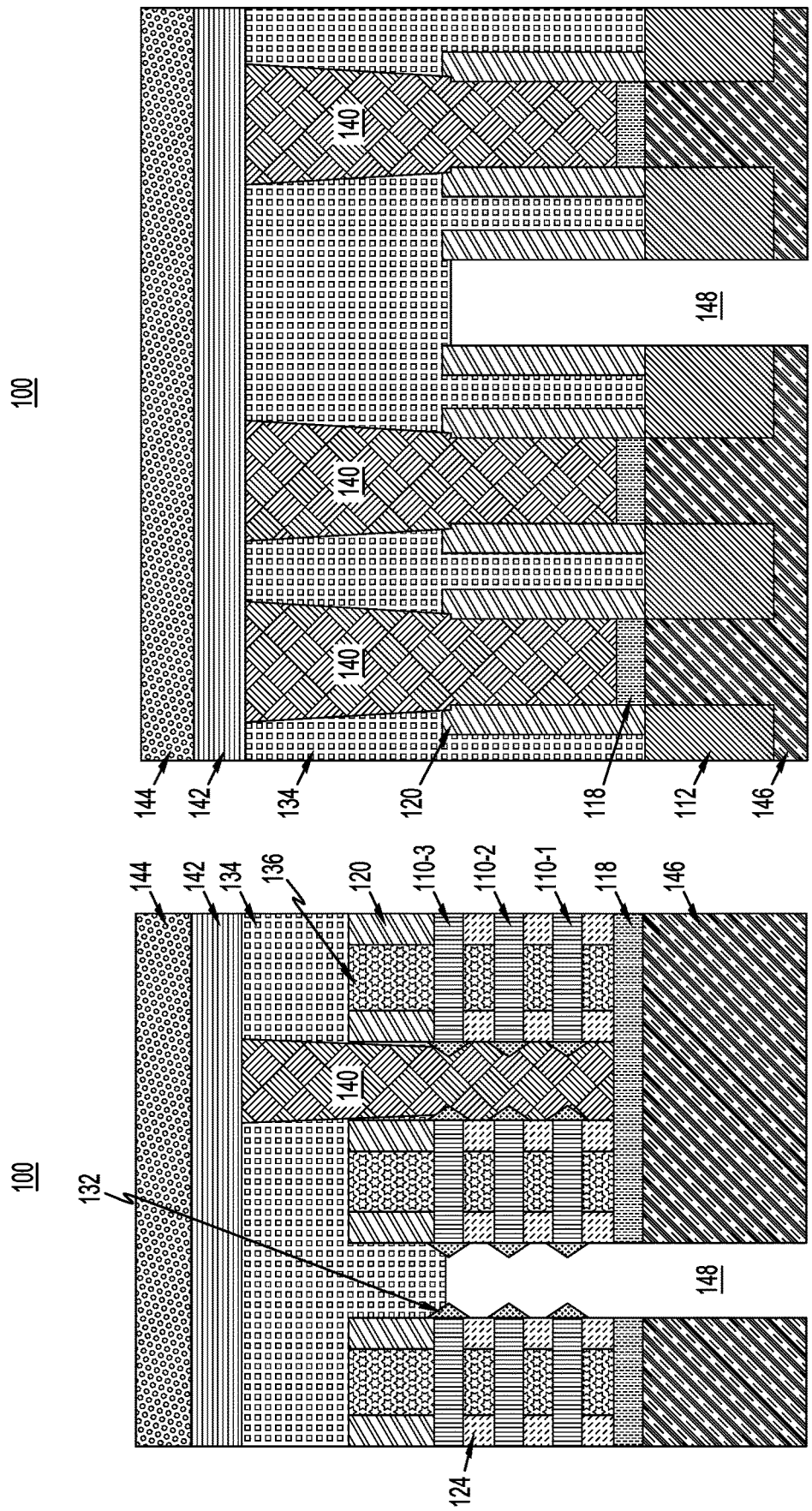

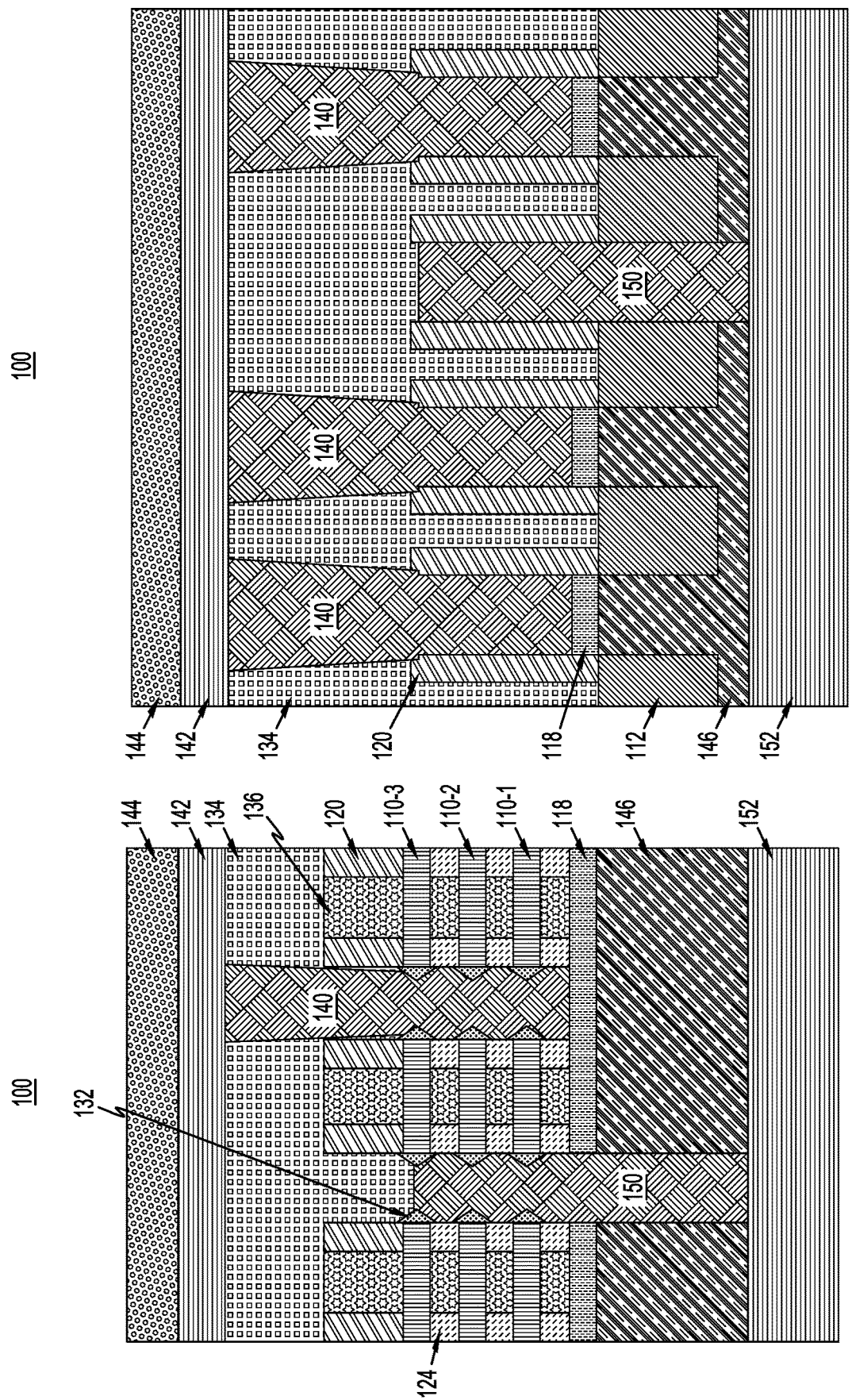

SEMICONDUCTOR STRUCTURE WITH WRAPPED-AROUND BACKSIDE CONTACT

BACKGROUND

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor FETs (MOSFETs). Complementary MOS (CMOS) devices are widely used, where both n-type and p-type transistors (nFET and pFET) are used to form logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

SUMMARY

Illustrative embodiments of the present application include techniques for use in semiconductor manufacture. In an illustrative embodiment, a semiconductor structure comprises a backside contact, and an unmerged source/drain region. The backside contact is wrapped-around the unmerged source/drain region.

In another illustrative embodiment, a semiconductor structure comprises a backside contact, a first unmerged source/drain region, a frontside contact, and a second unmerged source/drain region. The backside contact is wrapped-around the first unmerged source/drain region. The frontside contact is wrapped-around the second unmerged source/drain region.

In yet another illustrative embodiment, an integrated circuit comprises one or more semiconductor structures. At least one of the one or more semiconductor structures comprises a backside contact, a first unmerged source/drain region, a frontside contact; and a second unmerged source/drain region. The backside contact is wrapped-around the first unmerged source/drain region. The frontside contact is wrapped-around the second unmerged source/drain region.

Other embodiments will be described in the following detailed description of embodiments, which is to be read in conjunction with the accompanying figures.

BRIEF DESCRIPTION OF THE DRAWINGS

FIG. 2C depicts a side cross-sectional view of the semiconductor structure taken along the Y-Y axis of FIG. 2A for use at the second-intermediate fabrication stage, according to an illustrative embodiment.

FIG. 3A depicts a side cross-sectional view of a semiconductor structure taken along the X-X axis of FIG. 2A for use at a third-intermediate fabrication stage, according to an illustrative embodiment.

FIG. 3B depicts a side cross-sectional view of a semiconductor structure taken along the Y-Y axis of FIG. 2A for use at the third-intermediate fabrication stage, according to an illustrative embodiment.

FIG. 6A depicts a side cross-sectional view of a semiconductor structure taken along the X-X axis of FIG. 2A for use at a sixth-intermediate fabrication stage, according to an illustrative embodiment.

FIG. 6B depicts a side cross-sectional view of a semiconductor structure taken along the Y-Y axis of FIG. 2A for use at the sixth-intermediate fabrication stage, according to an illustrative embodiment.

FIG. 7A depicts a side cross-sectional view of a semiconductor structure taken along the X-X axis of FIG. 2A for use at a seventh-intermediate fabrication stage, according to an illustrative embodiment.

FIG. 7B depicts a side cross-sectional view of a semiconductor structure taken along the Y-Y axis of FIG. 2A for use at the seventh-intermediate fabrication stage, according to an illustrative embodiment.

FIG. 8A depicts a side cross-sectional view of a semiconductor structure taken along the X-X axis of FIG. 2A for use at an eighth-intermediate fabrication stage, according to an illustrative embodiment.

FIG. 8B depicts a side cross-sectional view of a semiconductor structure taken along the Y-Y axis of FIG. 2A for use at the eighth-intermediate fabrication stage, according to an illustrative embodiment.

FIG. 11A depicts a side cross-sectional view of a semiconductor structure taken along the X-X axis of FIG. 2A for use at an eleventh-intermediate fabrication stage, according to an illustrative embodiment.

FIG. 11B depicts a side cross-sectional view of a semiconductor structure taken along the Y-Y axis of FIG. 2A for use at the eleventh-intermediate fabrication stage, according to an illustrative embodiment.

FIG. 12A depicts a side cross-sectional view of a semiconductor structure taken along the X-X axis of FIG. 2A for use at a twelfth-intermediate fabrication stage, according to an illustrative embodiment.

FIG. 12B depicts a side cross-sectional view of a semiconductor structure taken along the Y-Y axis of FIG. 2A for use at the twelfth-intermediate fabrication stage, according to an illustrative embodiment.

FIG. 14A depicts a side cross-sectional view of a semiconductor structure taken along the X-X axis of FIG. 2A for use at a fourteenth-intermediate fabrication stage, according to an illustrative embodiment.

FIG. 14B depicts a side cross-sectional view of a semiconductor structure taken along the Y-Y axis of FIG. 2A for use at the fourteenth-intermediate fabrication stage, according to an illustrative embodiment.

FIG. 17A depicts a side cross-sectional view of a semiconductor structure taken along the X-X axis of FIG. 2A for use at a seventeenth-intermediate fabrication stage, according to an illustrative embodiment.

FIG. 17B depicts a side cross-sectional view of a semiconductor structure taken along the Y-Y axis of FIG. 2A for use at the seventeenth-intermediate fabrication stage, according to an illustrative embodiment.

FIG. 19A depicts a side cross-sectional view of a semiconductor structure taken along the X-X axis of FIG. 2A for use at a nineteenth-intermediate fabrication stage, according to an illustrative embodiment.

FIG. 19B depicts a side cross-sectional view of a semiconductor structure taken along the Y-Y axis of FIG. 2A for use at the nineteenth-intermediate fabrication stage, according to an illustrative embodiment.

DETAILED DESCRIPTION

Figure 1:
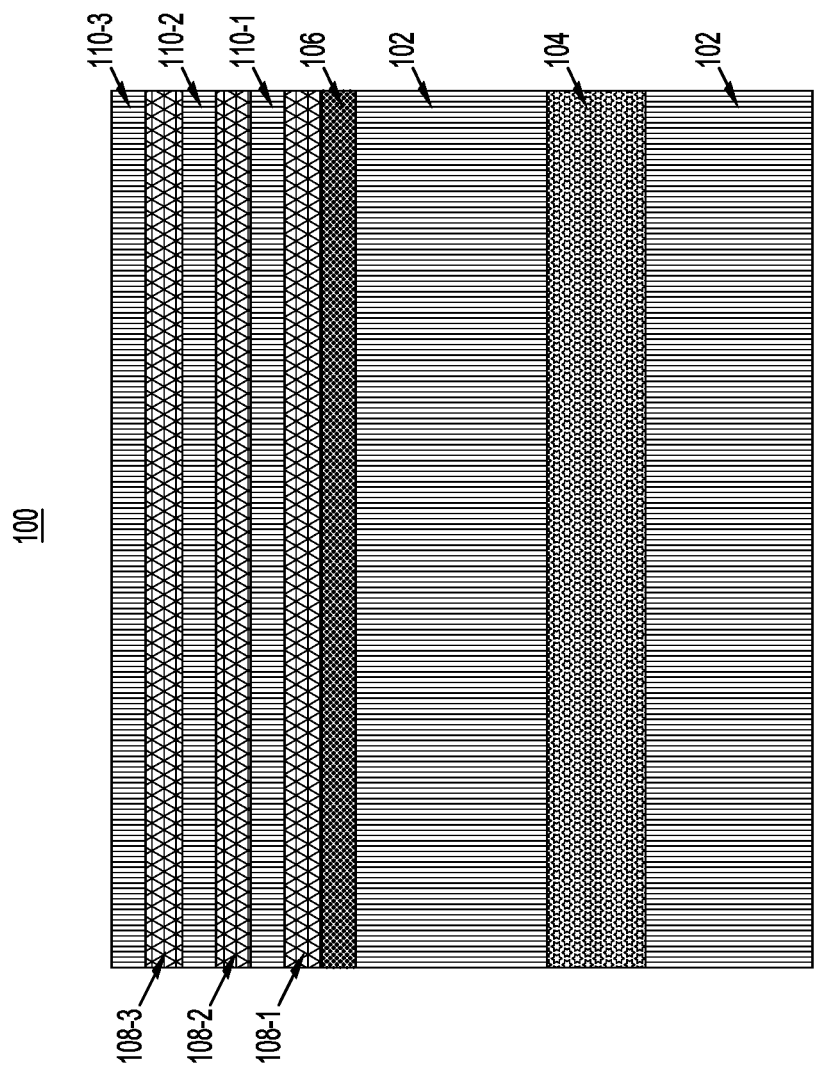
FIG. 1 depicts a cross sectional view illustrating a semiconductor structure for use at a first-intermediate fabrication stage, according to an illustrative embodiment.

Illustrative embodiments of the invention may be described herein in the context of illustrative methods for forming a backside contact that is wrapped-around an unmerged source/drain region in semiconductor structures to prevent a higher resistance-capacitance product (RC), along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices. The term "unmerged" illustratively refers to source/drain regions that are grown on an end of sidewalls of nanosheet channel layers in an opening that do not connect with the source/drain regions grown on the end of opposing sidewalls of nanosheet channel layers in the opening.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

In the IC chip fabrication industry, there are three sections referred to in a typical IC chip build: front-end-of-line (FEOL), back-end-of-line (BEOL), and the section that connects those two together, the middle-of-line (MOL). The FEOL is made up of the semiconductor devices, e.g., transistors, the BEOL is made up of interconnects and wiring, and the MOL is an interconnect between the FEOL and BEOL that includes material to prevent the diffusion of BEOL metals to FEOL devices. Accordingly, illustrative embodiments described herein may be directed to BEOL semiconductor processing and structures. BEOL is the second portion of IC fabrication where the individual devices (e.g., transistors, capacitors, resistors, etc.) become interconnected with wiring on the wafer, e.g., the metallization layer or layers. BEOL includes contacts, insulating layers (dielectrics), metal levels, and bonding sites for chip-to-package connections. In the BEOL, part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One concern in forming a backside contact is a higher resistance-capacitance product due to present semiconductor processing which cannot perform a high temperature anneal when a BEOL interconnect is formed in a frontside of a semiconductor substrate. Illustrative embodiments provide methods and structures for overcoming the foregoing drawbacks by forming a wrapped-around backside contact. Referring now to FIGS. 1-19B, FIG. 1 shows a semiconductor structure 100 having substrate 102 and etch stop layer 104 formed in the substrate 102. The substrate 102 may be formed of any suitable semiconductor structure, including various silicon-containing materials including but not limited to silicon (Si), silicon germanium (SiGe), silicon germanium carbide (SiGeC), silicon carbide (SiC) and multilayers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), etc. In one illustrative embodiment, substrate 102 is silicon.

The etch stop layer 104 may comprise a buried oxide (BOX) layer or silicon germanium (SiGe), or another suitable material such as a III-V semiconductor epitaxial layer.

Nanosheets are formed over the substrate 102, where the nanosheets include sacrificial layer 106, sacrificial layers 108-1, 108-2 and 108-3 (collectively, sacrificial layers 108) and nanosheet channel layers 110-1, 110-2 and 110-3 (collectively, nanosheet channel layers 110).

The sacrificial layer 106 and sacrificial layers 108 are illustratively formed of different sacrificial materials, such that they may be etched or otherwise removed selective to one another. In some embodiments, both the sacrificial layer 106 and sacrificial layers 108 are formed of SiGe, but with different percentages of Ge. For example, the sacrificial layer 106 may have a relatively higher percentage of Ge (e.g., 55% Ge), and the sacrificial layers 108 may have a relatively lower percentage of Ge (e.g., 25% Ge). Other combinations of different sacrificial materials may be used in other embodiments.

The nanosheet channel layers 110 may be formed of Si or another suitable material (e.g., a material similar to that used for the substrate 102).

Although three layers each of the sacrificial layers 108 and the nanosheet channel layers 110 are shown, the number of sacrificial layers 108 and the nanosheet channel layers 110 should not be considered limiting and any number are contemplated.

Figure 2B:
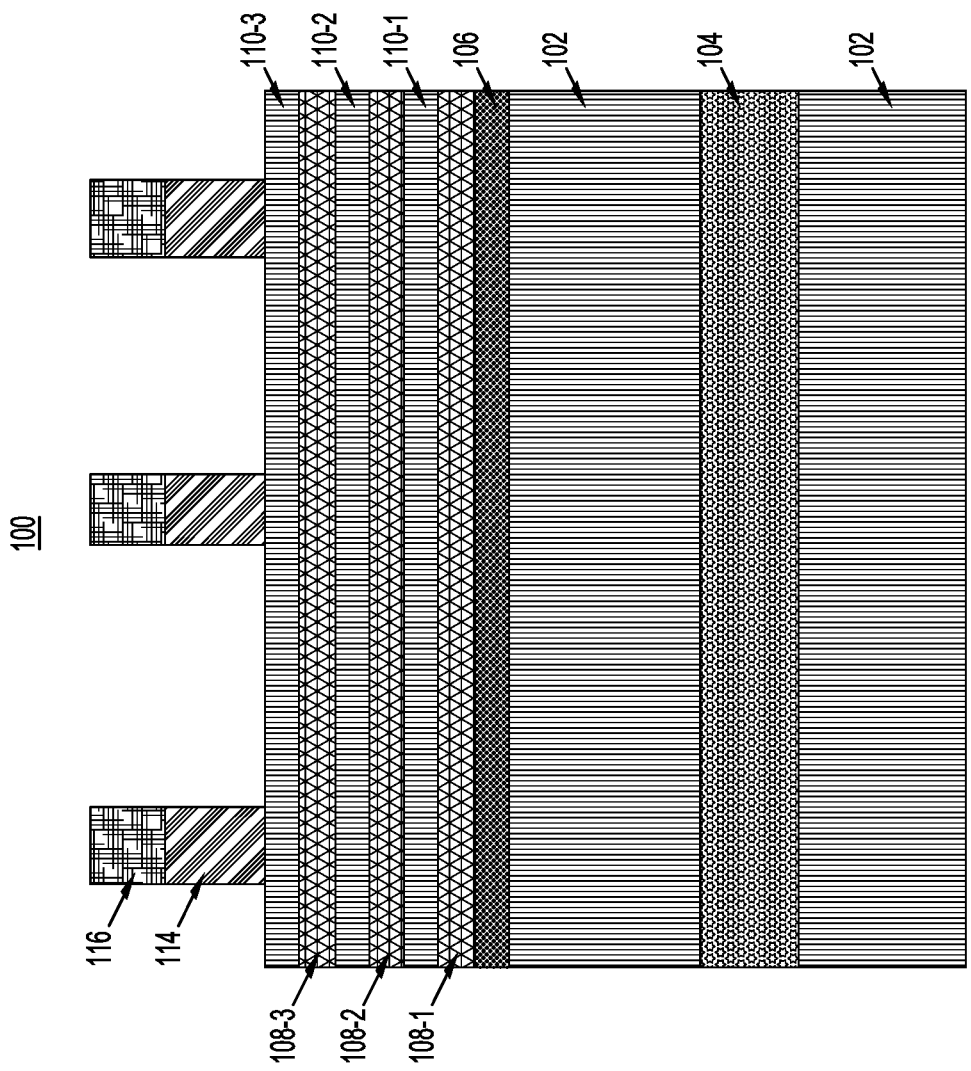
FIG. 2B depicts a side cross-sectional view of the semiconductor structure taken along the X-X axis of FIG. 2A for use at the second-intermediate fabrication stage, according to an illustrative embodiment.
Figure 2A:
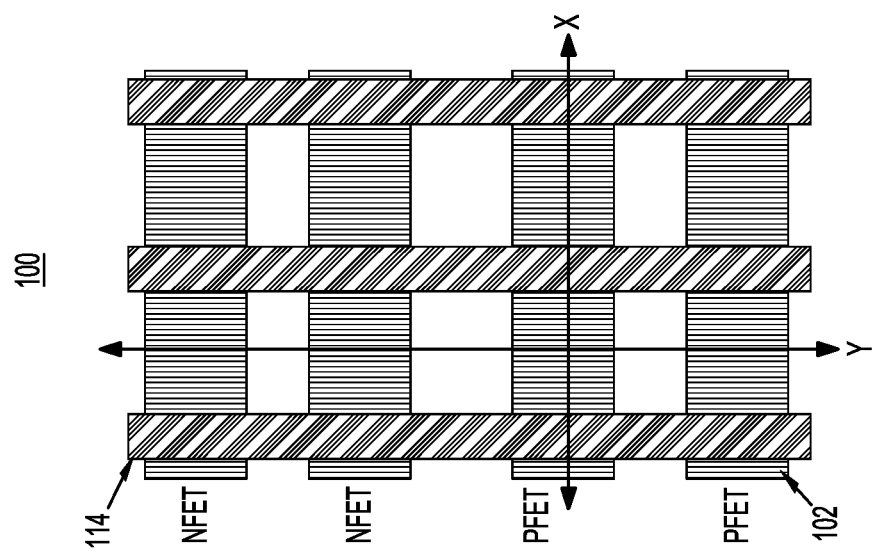
FIG. 2A depicts a top view of a semiconductor structure for use at a second-intermediate fabrication stage, according to an illustrative embodiment.

FIGS. 2A-2C show semiconductor structure 100 at a second-intermediate fabrication stage. During this stage, nanosheet patterning and formation of FET stacks 109a, 109b, 109c and 109d together with shallow trench isolation (STI) regions 112 and dummy gates 114 are carried out. Each of FET stacks 109a, 109b, 109c and 109d contain a respective FET device. However, this is merely illustrative and it is contemplated that FET stacks 109a, 109b, 109c and 109d can contain any number of FET devices. The FET stacks 109a, 109b, 109c and 109d may comprise nFET devices or pFET devices or combinations thereof.

FIG. 2B shows semiconductor structure 100 having dummy gate 114 and hardmask layer 116 on the top most nanosheet channel layer 110-3. Suitable dummy gate material includes, for example, polycrystalline silicon, amorphous silicon or microcrystal silicon. Hardmask layer 116 can be composed of a flowable organic material such as, for example, a spin-on-carbon (SOC), $Si_3N_4$, SiBCN, SiNC, SiN, SiCO, $SiO_2$, and SiNOC. The dummy gate can be formed by conventional lithographic and etching processes of hardmask layer 116.

FIG. 2C shows semiconductor structure 100 having STI regions 112. The STI regions 112 may be formed by patterning a hardmask layer (not shown), followed by etching exposed portions of the nanosheet channel layers 110, the sacrificial layers 108 and 106, and through a portion of the substrate 102. A dielectric material is then deposited to form STI regions 112, followed by a planarization step such as a chemical mechanical planarization (CMP) process and recess. The STI regions 112 may be formed of a suitable dielectric material such as silicon dioxide ($SiO_2$), silicon oxycarbide (SiOC), silicon oxynitride (SiON), etc. Following formation of STI regions 112, the patterned hardmask layer (not shown) is also removed.

FIGS. 3A and 3B show semiconductor structure 100 at a third-intermediate fabrication stage. During this stage, bottom dielectric isolation (BDI) layer 118 and sidewall spacers 120 are formed. BDI layer 118 can be formed by selectively removing sacrificial layer 106 without etching the sacrificial layers 108 and nanosheet channel layers 110 in the stack. That is, the sacrificial layer 106 can be etched/removed without removing the sacrificial layers 108 alternatingly formed with nanosheet channel layers 110. After removal of sacrificial layer 106, the cavity is replaced with a dielectric fill to form BDI layer 118. In one embodiment, the BDI layer 118 can be formed during deposition of sidewall spacers 120. In some other embodiments, the BDI layer 118 can be a different material than sidewall spacers 120. In one illustrative embodiment, the BDI layer 118 and sidewall spacers 120 can independently be a nitride or an oxynitride such as, for example, $Si_3N_4$, SiBCN, SiNC, SiN, SiCO, $SiO_2$ and SiNOC. In some exemplary embodiments, sidewall spacers 120 can include a material that is resistant to some etching processes such as, for example, HF chemical etching or chemical oxide removal etching. The BDI layer 118 and sidewall spacers 120 can be formed using conventional deposition techniques such as by physical vapor deposition (PVD), atomic layer deposition (ALD), chemical vapor deposition (CVD), etc.

Figures 4A, 4B:
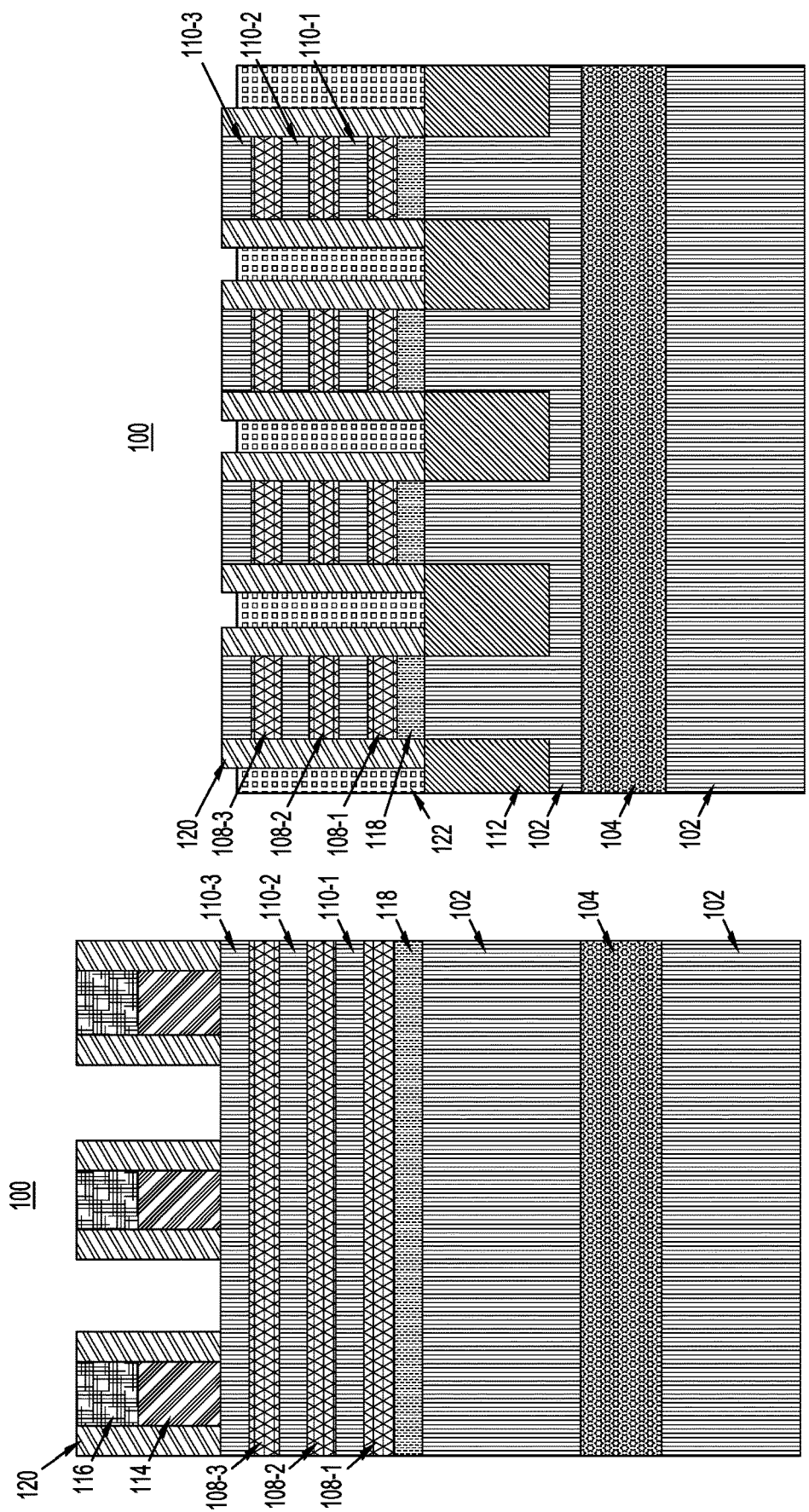
FIG. 4A depicts a side cross-sectional view of a semiconductor structure taken along the X-X axis of FIG. 2A for use at a fourth-intermediate fabrication stage, according to an illustrative embodiment.
FIG. 4B depicts a side cross-sectional view of a semiconductor structure taken along the Y-Y axis of FIG. 2A for use at the fourth-intermediate fabrication stage, according to an illustrative embodiment.

FIGS. 4A and 4B show semiconductor structure 100 at a fourth-intermediate fabrication stage. During this stage, interlayer dielectric (ILD) layer 122 is formed on STI regions 112 and between adjacent sidewall spacers 120. ILD layer 122 can be formed of any suitable dielectric material, such as $SiO_2$, SiOC, SiON, etc. The ILD layer 122 can be formed using conventional deposition techniques such as by PVD, ALD, CVD, etc. Next, an isotropic etch back is carried out on ILD layer 122 so that the top surface of ILD layer 122 is below the top surface of sidewall spacers 120.

Figures 5A, 5B:
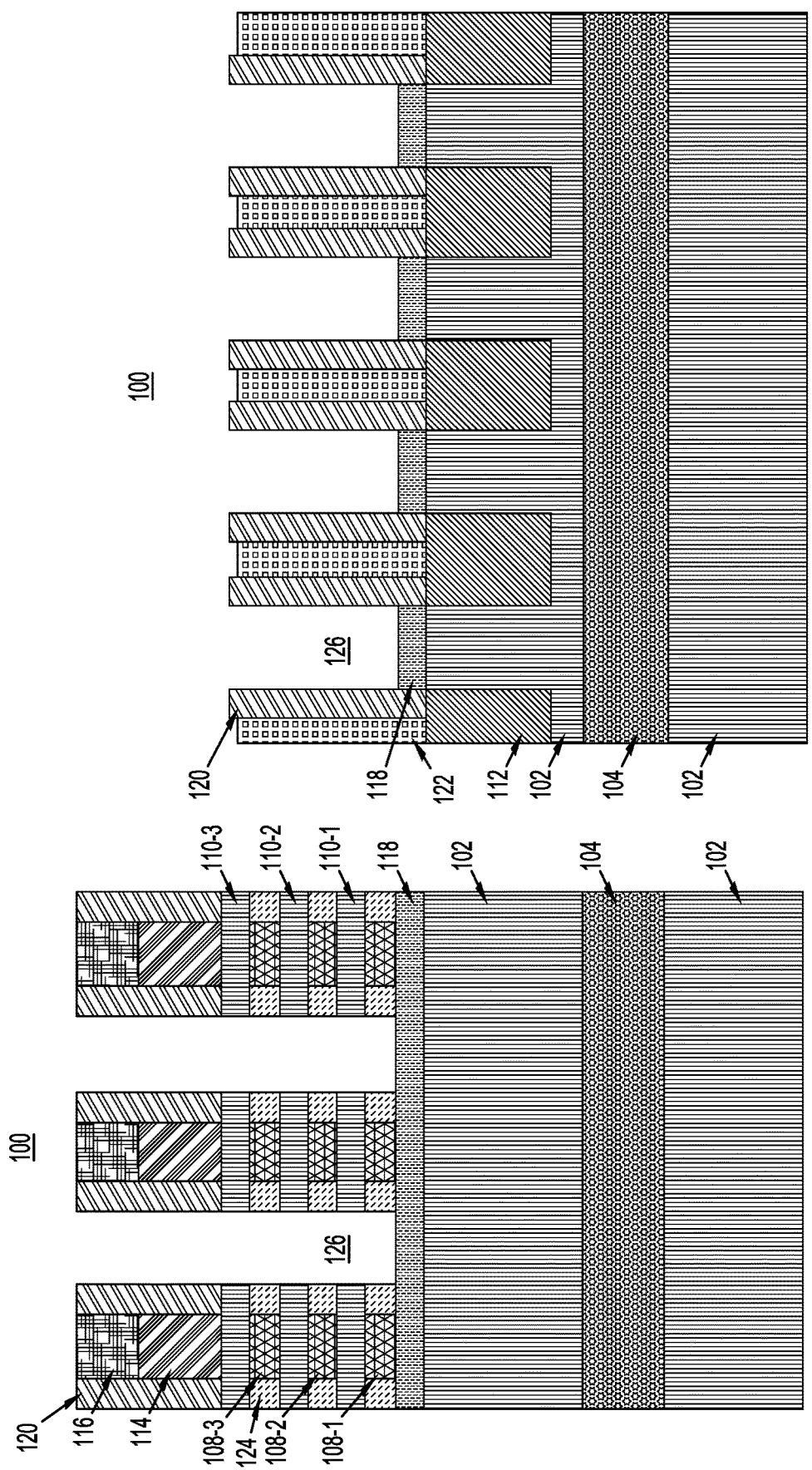
FIG. 5A depicts a side cross-sectional view of a semiconductor structure taken along the X-X axis of FIG. 2A for use at a fifth-intermediate fabrication stage, according to an illustrative embodiment.
FIG. 5B depicts a side cross-sectional view of a semiconductor structure taken along the Y-Y axis of FIG. 2A for use at the fifth-intermediate fabrication stage, according to an illustrative embodiment.

FIGS. 5A and 5B show semiconductor structure 100 at a fifth-intermediate fabrication stage. During this stage, inner spacers 124 and openings 126 are formed. Openings 126 are formed by selectively etching a portion of sacrificial layers 108 and nanosheet channel layers 110 until a top surface of BDI layer 118 is reached. Suitable etching processes include, for example, reactive ion etching (ME). The inner spacers 124 may be formed by filling indent spaces resulting from selective indent etches of the sacrificial layers 108. The inner spacers 124 may be formed of silicon nitride (SiN) or another suitable material such as SiBCN, silicon carbide oxide (SiCO), SiOCN, etc. The inner spacers 124 can be formed using conventional deposition techniques such as by PVD, ALD, CVD, etc., followed by an isotropic etching back of the dielectric liner. The inner spacers 124 may have heights matching that of the sacrificial layers 108.

FIGS. 6A and 6B show semiconductor structure 100 at a fifth-intermediate fabrication stage. During this stage, one of openings 126 is extended through substrate 102 and exposing a top surface of etch stop layer 104 to provide backside contact openings 126'. Backside contact openings 126' are formed by first depositing a mask layer 128 (such as an organic planarization layer (OPL) or a spin-on-carbon (SOC)) on semiconductor structure 100 using any conventional deposition process such spin-on coating or any other suitable deposition process. Next, the mask layer 128 is patterned and then selectively etched to form backside contact openings 126'.

FIGS. 7A and 7B show semiconductor structure 100 at a sixth-intermediate fabrication stage. During this stage, a sacrificial placeholder layer 130 is formed in backside contact openings 126' and below a top surface of BDI layer 118 using any conventional deposition process such as PVD, ALD and CVD, or bottom-up epitaxial growth process. Sacrificial placeholder layer 130 may be formed of a sacrificial material or materials, such as titanium oxide ($TiO_x$), aluminum oxide ($AlO_x$), silicon carbide (SiC), SiGe, III-V materials, etc.

FIGS. 8A and 8B show semiconductor structure 100 at an eighth-intermediate fabrication stage. During this stage, mask layer 128 is removed, for example, by an ash etching process, and openings 126 are formed again. Next, unmerged source/drain regions 132 are formed on nanosheet channel layers 110. Unmerged source/drain regions 132 may be formed using epitaxial growth processes. In non-limiting illustrative embodiments, the source/drain regions can be grown on nanosheet channel layers 110 until the source/drain regions reach a predetermined size, where the source/drain regions remain separate unmerged source/drains. In illustrative embodiments, the unmerged source/drain regions 132 are grown from ends of the sidewalls of nanosheet channel layers 110 in each of openings 126 and 126' and do not connect with each other. For example, the unmerged source/drain regions 132 grown on one end of sidewalls of nanosheet channel layers 110 in each of openings 126 and 126' do not connect with the unmerged source/drain regions 132 grown on the other end of sidewalls of nanosheet channel layers 110 in each of openings 126 and 126' between neighboring replacement gate structures 136 as discussed below.

Unmerged source/drain regions 132 may be suitably doped, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl). In some embodiments, the epitaxy process comprises in-situ doping (dopants are incorporated in epitaxy material during epitaxy). Epitaxial materials may be grown from gaseous or liquid precursors.

Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor to be formed. The dopant concentration in the source/drain can range from $1 \times 10^{19}$ cm$^{-3}$ to $3 \times 10^{21}$ cm$^{-3}$, or preferably between $2 \times 10^{20}$ cm$^{-3}$ to $3 \times 10^{20}$ cm$^{-3}$.

Figures 9A, 9B:
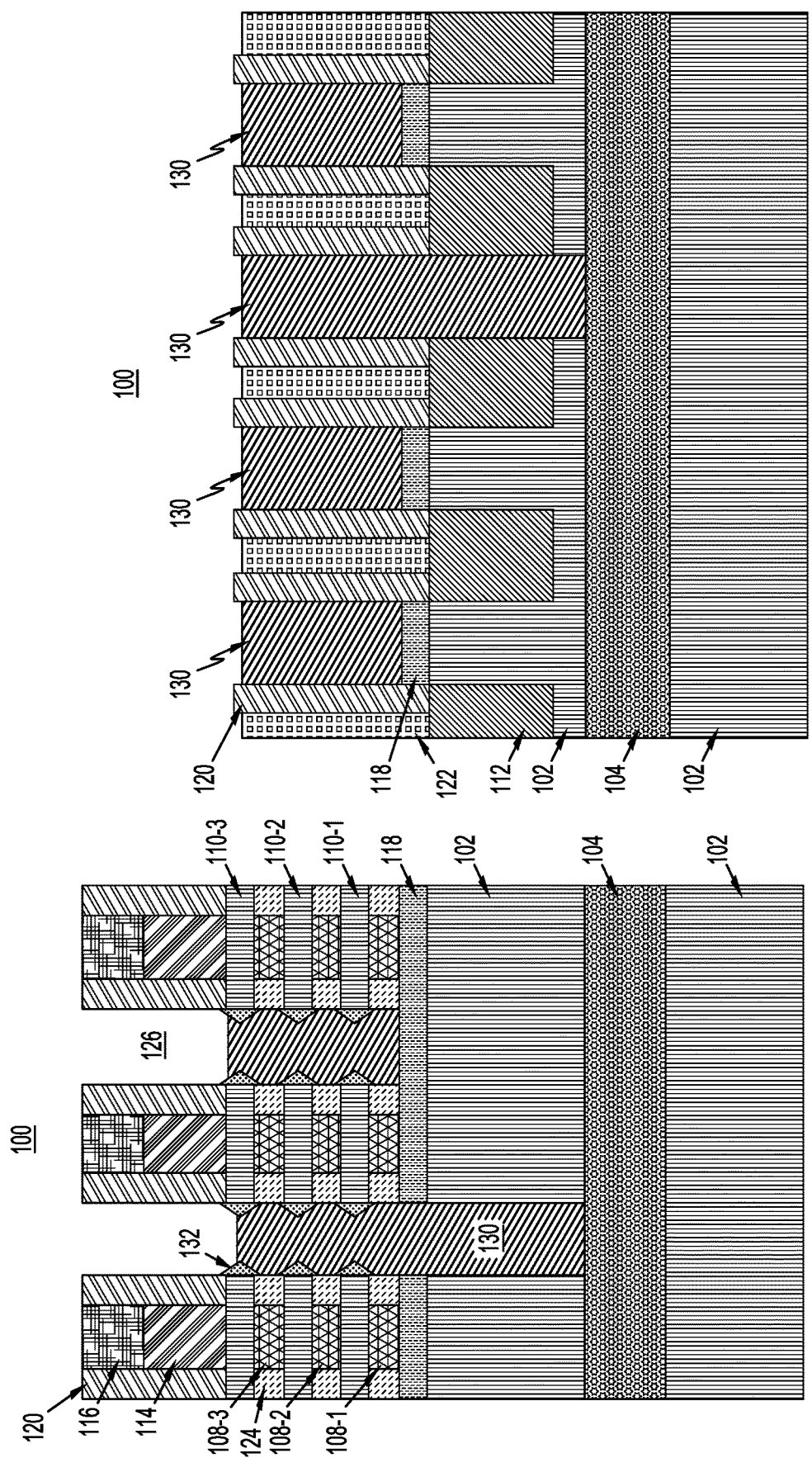
FIG. 9A depicts a side cross-sectional view of a semiconductor structure taken along the X-X axis of FIG. 2A for use at a ninth-intermediate fabrication stage, according to an illustrative embodiment.
FIG. 9B depicts a side cross-sectional view of a semiconductor structure taken along the Y-Y axis of FIG. 2A for use at the ninth-intermediate fabrication stage, according to an illustrative embodiment.

FIGS. 9A and 9B show semiconductor structure 100 at a ninth-intermediate fabrication stage. During this stage, additional sacrificial placeholder layer 130 is formed in openings 126 and 126' using any conventional deposition process such as PVD, ALD and CVD. Sacrificial placeholder layer 130 can then be subjected to a planarization process such as CMP or other suitable planarization process. As depicted in FIG. 9A, additional sacrificial placeholder layer 130 is selectively recessed to expose sidewall spacers 120 using any suitable wet or dry etch. Alternatively, the sacrificial placeholder layer 130 can also be formed by selectively epi growth.

Figures 10A, 10B:
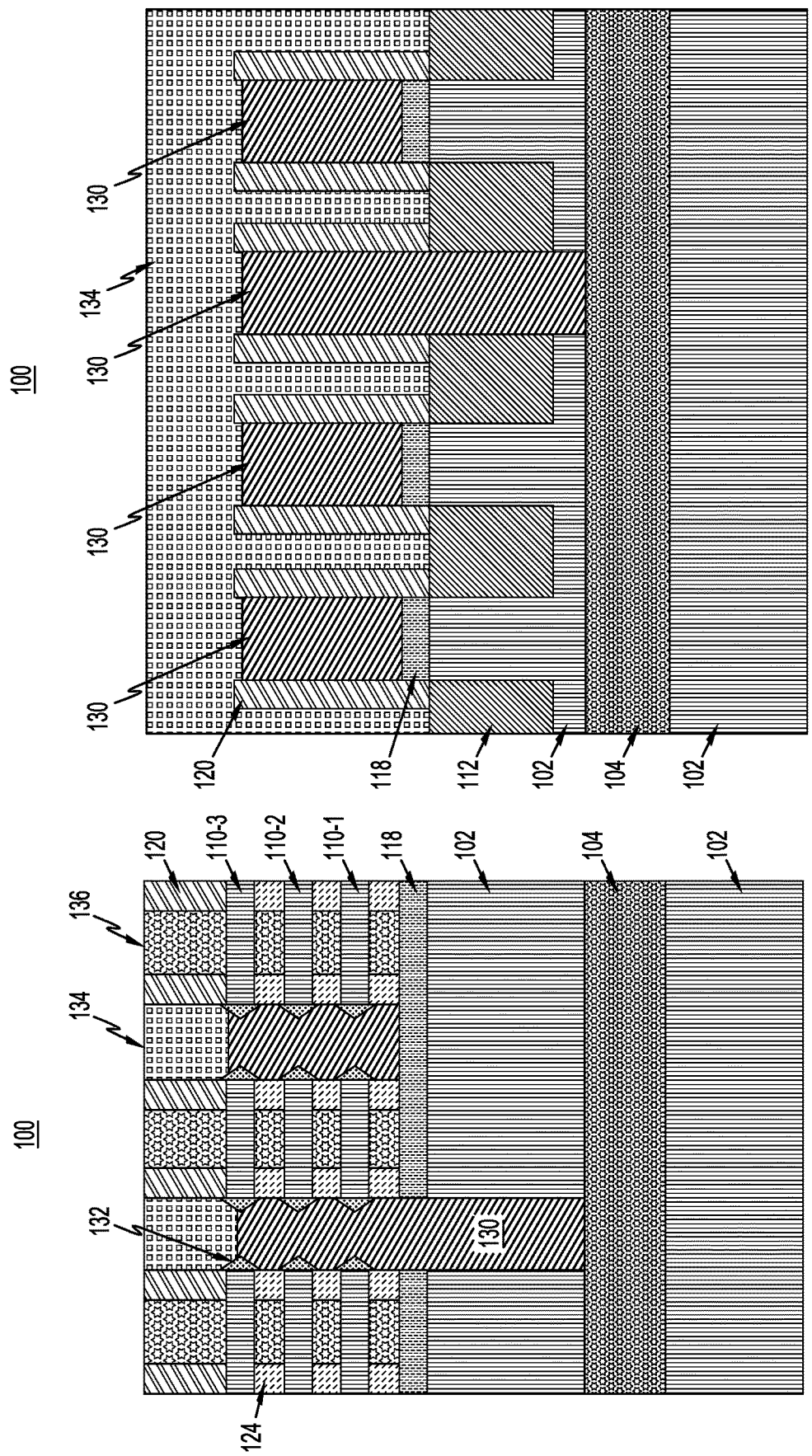
FIG. 10A depicts a side cross-sectional view of a semiconductor structure taken along the X-X axis of FIG. 2A for use at a tenth-intermediate fabrication stage, according to an illustrative embodiment.
FIG. 10B depicts a side cross-sectional view of a semiconductor structure taken along the Y-Y axis of FIG. 2A for use at the tenth-intermediate fabrication stage, according to an illustrative embodiment.

FIGS. 10A and 10B show semiconductor structure 100 at a tenth-intermediate fabrication stage. During this stage, ILD layer 134 is formed on unmerged source/drain regions 132, followed by a planarization process such as CMP. ILD layer 134 can be formed by a similar process and of a similar material as ILD layer 122. Next, exposed sidewall spacers 120 and hardmask layer 116 are selectively removed using any suitable etching process.

One or more wet or dry etching processes are then performed to remove the dummy gate 114 and sacrificial layers 108 to thereby define a gate cavity where a replacement gate structure will subsequently be formed for the semiconductor structure 100. Replacement gate structures 136 are then formed in the gate cavity. The replacement gate structures 136 depicted herein are intended to be representative in nature of any type of gate structure that may be employed in manufacturing integrated circuit products using so-called gate-last (replacement gate) manufacturing techniques. The replacement gate structure typically comprises a high-k (e.g., a k value greater than 5 or greater than 10) gate insulation layer (not individually shown), such as hafnium oxide, one or more metal layers (not individually shown) (e.g., layers of titanium nitride or TiAlC depending upon the type of transistor device being manufactured), and a bulk conductive material layer (not individually shown), such as tungsten or aluminum.

FIGS. 11A and 11B show semiconductor structure 100 at an eleventh-intermediate fabrication stage. During this stage, frontside middle-of-the-line contact openings 138 are formed by first depositing an additional amount of ILD layer 134 on semiconductor structure 100, followed by a planarization process such as CMP. Next, ILD layer 134 is subjected to a conventional lithographic and etching process to form frontside middle-of-the-line contact openings 138. The frontside middle-of-the-line contact openings 138 are formed to expose the sacrificial placeholder layer 130. In addition, ILD layer 134 remains over sacrificial placeholder layer 130 formed in backside contact openings 126' discussed above.

FIGS. 12A and 12B show semiconductor structure 100 at a twelfth-intermediate fabrication stage. During this stage, sacrificial placeholder layer 130 present in frontside middle-of-the-line contact openings 138 is selectively removed using any suitable etch processing that removes the material of the sacrificial placeholder layer 130 selective to that of the rest of the structure. A suitable etching process include, for example, RIE.

Figures 13A, 13B:
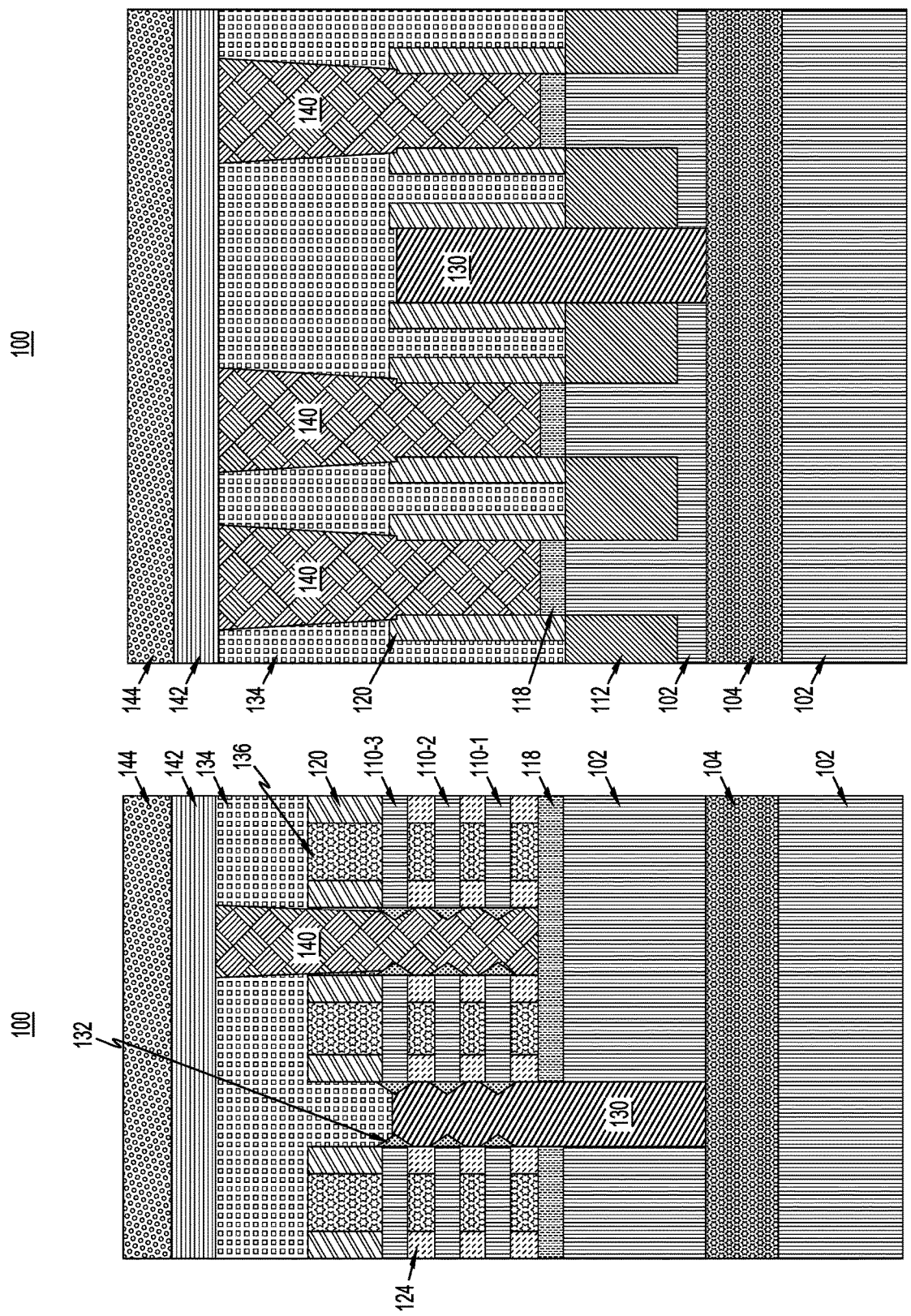
FIG. 13A depicts a side cross-sectional view of a semiconductor structure taken along the X-X axis of FIG. 2A for use at a thirteenth-intermediate fabrication stage, according to an illustrative embodiment.
FIG. 13B depicts a side cross-sectional view of a semiconductor structure taken along the Y-Y axis of FIG. 2A for use at the thirteenth-intermediate fabrication stage, according to an illustrative embodiment.

FIGS. 13A and 13B show semiconductor structure 100 at a thirteenth-intermediate fabrication stage following formation of a metallization layer and frontside back-end-of-line (BEOL) interconnects and following bonding of the structure to a carrier wafer. During this stage, frontside middle-of-the-line contacts 140 are formed by depositing a high conductance metal using any conventional technique such as ALD, CVD, PVD, and/or plating. Suitable contact metals include, a silicide liner such as Ti, Ni, or NiPt, etc, a thin adhesion metal liner, such as TiN, and high conductive metal fills, such as, for example, tungsten (W), aluminum (Al), copper (Cu), cobalt (Co), ruthenium (Ru), molybdenum (Mo), or any other suitable conductive material. The contact metals can be planarized using, for example, a planarizing process such as CMP. Other planarization processes can include grinding and polishing. As shown in FIG. 13B, frontside middle-of-the-line contacts 140 are wrapped around unmerged source/drain regions 132. Thus, frontside middle-of-the-line contacts 140 can also be referred to as wrapped-around frontside contacts.

Frontside BEOL interconnect 142 includes various BEOL interconnect structures. For example, frontside BEOL interconnect 142 is a metallization structure that includes one or more metal layers disposed on a side of semiconductor structure 100 opposite of the side on which the backside BEOL metallization structure is disposed. The metal layers of the frontside BEOL interconnect 142 each have metal lines for making interconnections to the semiconductor device.

Carrier wafer 144 may be formed of materials similar to that of the substrate 102, and may be formed over the frontside BEOL interconnect 142 using a wafer bonding process, such as dielectric-to-dielectric bonding.

FIGS. 14A and 14B show semiconductor structure 100 at a fourteenth-intermediate fabrication stage. During this stage, backside processing of the substrate 102 is carried out. This can be accomplished, for example, by flipping the structure over so that the backside of the substrate 102 (i.e., the back surface) is facing up. First, portions of the substrate 102 may be removed from the backside using, for example, a combination of wafer grinding, CMP, dry etch and wet etch to selectively remove substrate 102 until the etch stop layer 104 is reached.

Figures 15A, 15B:
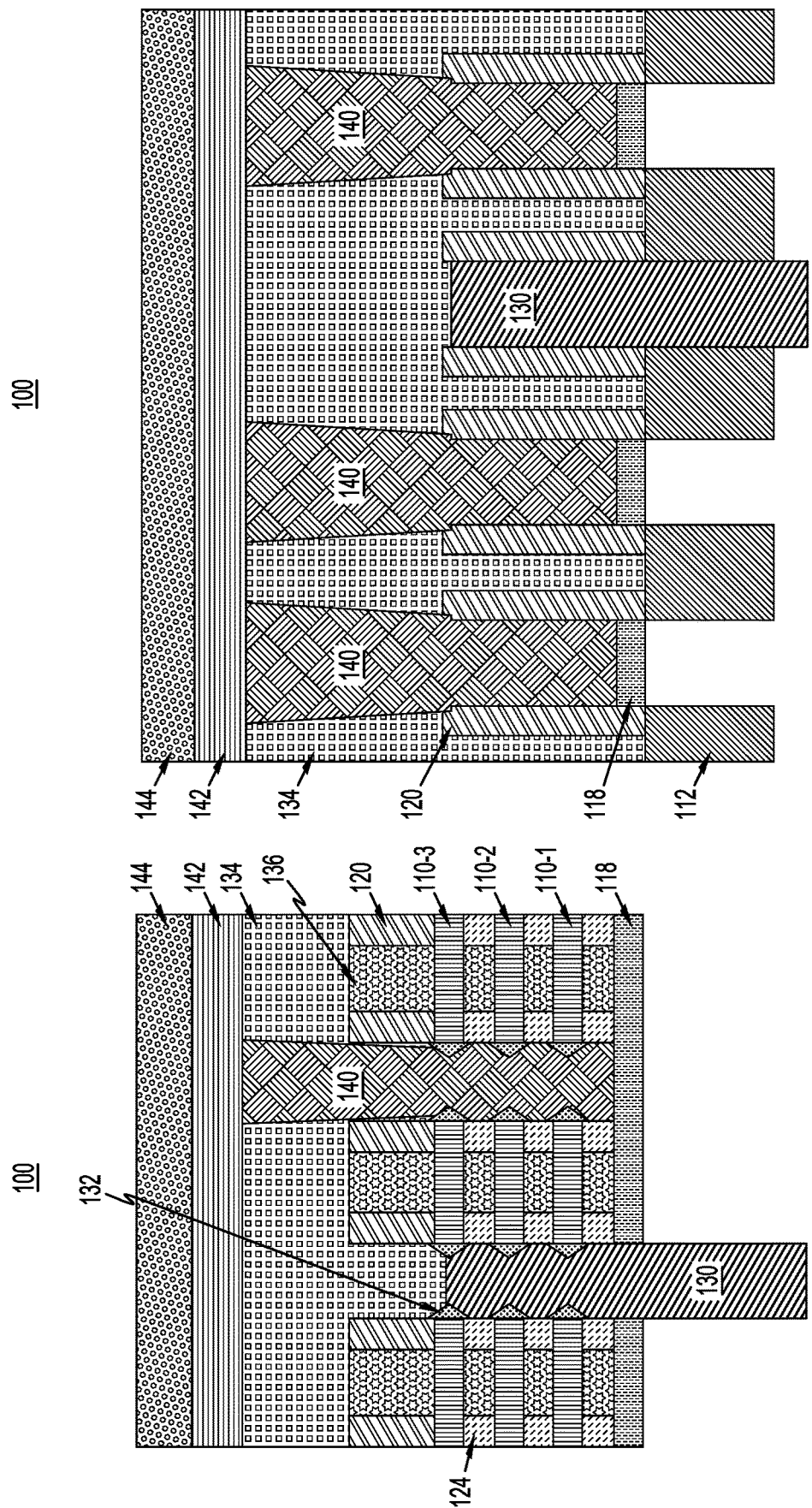
FIG. 15A depicts a side cross-sectional view of a semiconductor structure taken along the X-X axis of FIG. 2A for use at a fifteenth-intermediate fabrication stage, according to an illustrative embodiment.
FIG. 15B depicts a side cross-sectional view of a semiconductor structure taken along the Y-Y axis of FIG. 2A for use at the fifteenth-intermediate fabrication stage, according to an illustrative embodiment.

FIGS. 15A and 15B illustrate semiconductor structure 100 at a fifteenth-intermediate fabrication stage. During this stage, the etch stop layer 104 is selectively removed using, for example, a wet etch to selectively remove etch stop layer 104 until substrate 102 is reached. The remaining portions of the substrate 102 are removed utilizing a selective etch process such as a wet etch.

Figures 16A, 16B:
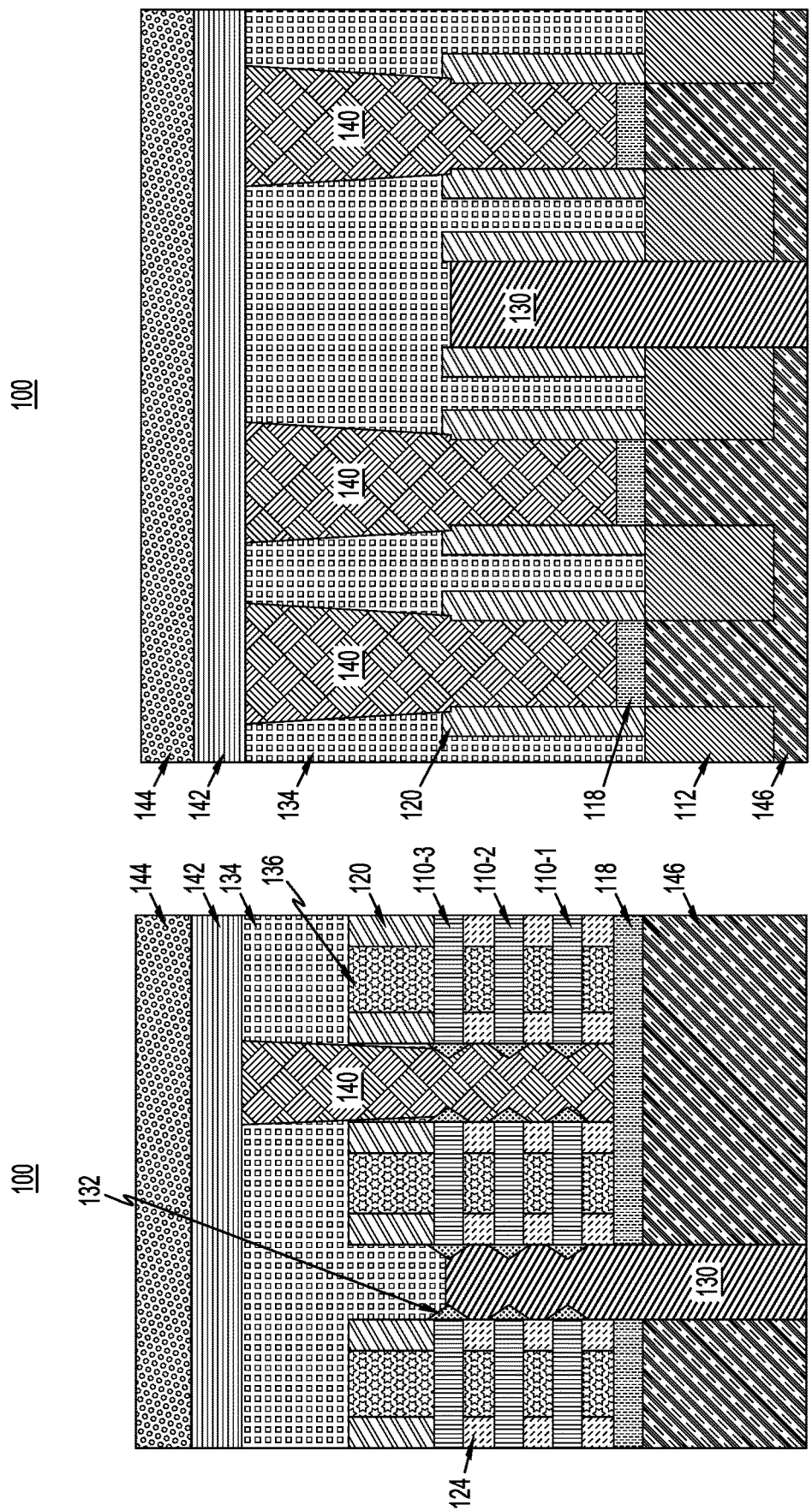
FIG. 16A depicts a side cross-sectional view of a semiconductor structure taken along the X-X axis of FIG. 2A for use at a sixteenth-intermediate fabrication stage, according to an illustrative embodiment.
FIG. 16B depicts a side cross-sectional view of a semiconductor structure taken along the Y-Y axis of FIG. 2A for use at the sixteenth-intermediate fabrication stage, according to an illustrative embodiment.

FIGS. 16A and 16B illustrate semiconductor structure 100 at a sixteenth-intermediate fabrication stage. During this stage, backside ILD layer 146 may be formed of similar processes and material as ILD layer 122. The material of the backside ILD layer 146 may initially be overfilled, followed by planarization (e.g., using CMP).

FIGS. 17A and 17B illustrate semiconductor structure 100 at a seventeenth-intermediate fabrication stage. During this stage, sacrificial placeholder layer 130 is selectively removed to form a backside contact opening 148 using any suitable etch processing that removes the material of the sacrificial placeholder layer 130 selective to that of the rest of the structure. A suitable etching process include, for example, ME.

Figures 18A, 18B:
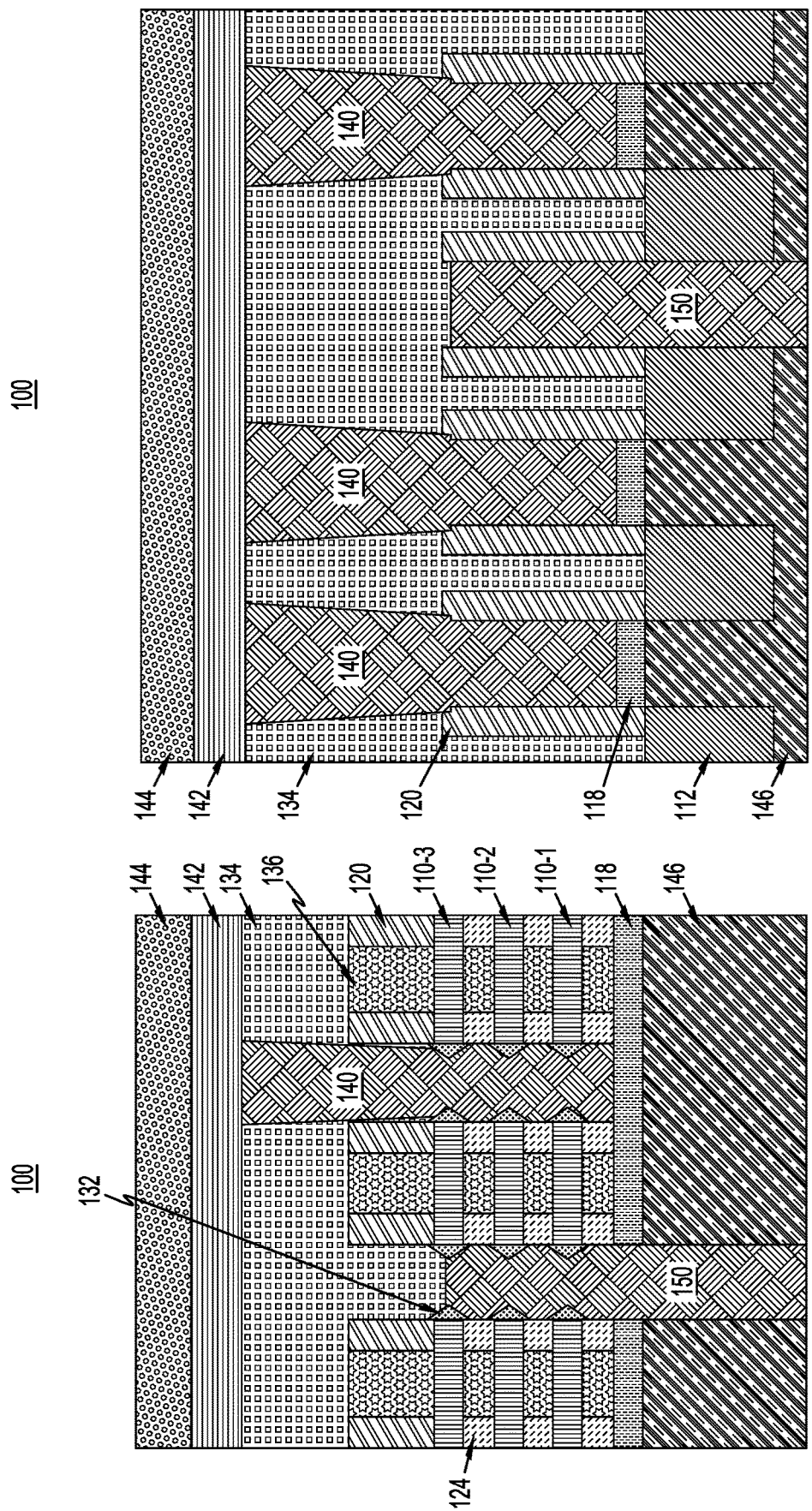
FIG. 18A depicts a side cross-sectional view of a semiconductor structure taken along the X-X axis of FIG. 2A for use at an eighteenth-intermediate fabrication stage, according to an illustrative embodiment.
FIG. 18B depicts a side cross-sectional view of a semiconductor structure taken along the Y-Y axis of FIG. 2A for use at the eighteenth-intermediate fabrication stage, according to an illustrative embodiment.

FIGS. 18A and 18B illustrate semiconductor structure 100 at an eighteenth-intermediate fabrication stage. During this stage, backside contacts 150 are formed by depositing a suitable metal in the backside contact opening 148. A suitable metal can be any of the metals discussed above for frontside middle-of-the-line contact 140. As shown in FIG.

18B, backside contacts 150 are wrapped around unmerged source/drain regions 132. Thus, backside contacts 150 can also be referred to as wrapped-around backside contacts.

FIGS. 19A and 19B illustrate semiconductor structure 100 at a nineteenth-intermediate fabrication stage. During this stage, backside BEOL interconnect 152 is formed on backside ILD layer 146 and backside contacts 150 using similar processes and similar structures as frontside BEOL interconnect 142.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a backside contact;
   a frontside interlevel dielectric layer disposed on a top surface of the backside contact; and
   an unmerged source/drain region;
   wherein the backside contact is wrapped-around the unmerged source/drain region.

2. The semiconductor structure according to claim 1, wherein a portion of the backside contact is disposed in a backside interlayer dielectric layer.

3. The semiconductor structure according to claim 2, wherein another portion of the backside contact is disposed on the unmerged source/drain region.

4. The semiconductor structure according to claim 1, wherein the unmerged source/drain region is disposed on opposing sidewalls of nanosheet channel layers.

5. The semiconductor structure according to claim 1, further comprising:
   a gate structure disposed adjacent the unmerged source/drain region.

6. The semiconductor structure according to claim 5, wherein the gate structure is part of a stack of nanosheet channel layers.

7. The semiconductor structure according to claim 6, wherein the unmerged source/drain region is disposed on opposing sidewalls of each of the nanosheet channel layers.

8. The semiconductor structure according to claim 2, further comprising:
   a backside interconnect structure disposed on the backside contact and the backside interlayer dielectric layer.

9. The semiconductor structure according to claim 5, further comprising a frontside interconnect structure disposed over the gate structure.

10. A semiconductor structure, comprising:
    a backside contact;
    a frontside interlevel dielectric layer disposed on a top surface of the backside contact;
    a first unmerged source/drain region;
    a frontside contact; and
    a second unmerged source/drain region;
    wherein the backside contact is wrapped-around the first unmerged source/drain region; and
    wherein the frontside contact is wrapped-around the second unmerged source/drain region.

11. The semiconductor structure according to claim 10, wherein a portion of the backside contact is disposed in a backside interlayer dielectric layer.

12. The semiconductor structure according to claim 11, wherein another portion of the backside contact is disposed on the first unmerged source/drain region.

13. The semiconductor structure according to claim 10, further comprising:
    gate structures disposed adjacent the first unmerged source/drain region and the second unmerged source/drain region.

14. The semiconductor structure according to claim 13, wherein each of the gate structures is part of a stack of nanosheet channel layers.

15. The semiconductor structure according to claim 14, wherein the first unmerged source/drain region is disposed on opposing sidewalls of respective nanosheet channel layers, and the second unmerged source/drain region is disposed on opposing sidewalls of respective nanosheet channel layers.

16. The semiconductor structure according to claim 11, further comprising:
    a backside interconnect structure disposed on the wrapped-around backside contact and the backside interlayer dielectric layer.

17. The semiconductor structure according to claim 13, further comprising a frontside interconnect structure disposed over the gate structures.

18. An integrated circuit, comprising:
one or more semiconductor structures, wherein at least one of the one or more semiconductor structures comprises:
a backside contact;
a frontside interlevel dielectric layer disposed on a top surface of the backside contact;
a first unmerged source/drain region;
a frontside contact; and
a second unmerged source/drain region;
wherein the backside contact is wrapped-around the first unmerged source/drain region; and
wherein the frontside contact is wrapped-around the second unmerged source/drain region.

19. The integrated circuit according to claim 18, wherein the at least one of the one or more semiconductor structures further comprises:
a plurality of gate structures disposed adjacent the first unmerged source/drain region and the second unmerged source/drain region;
wherein each of the gate structures is part of a stack of nanosheet channel layers.

20. The integrated circuit according to claim 19, wherein the first unmerged source/drain region is disposed on opposing sidewalls of respective nanosheet channel layers, and the second unmerged source/drain region is disposed on opposing sidewalls of respective nanosheet channel layers.

* * * * *